(12) United States Patent
Yamauchi et al.

(10) Patent No.: US 7,013,119 B2
(45) Date of Patent: Mar. 14, 2006

(54) RADIO COMMUNICATION APPARATUS AND ITS RECEPTION TIMING ESTIMATING METHOD

(75) Inventors: Takahisa Yamauchi, Tokyo (JP); Akihiro Shibuya, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 284 days.

(21) Appl. No.: 10/477,193

(22) PCT Filed: Jun. 3, 2002

(86) PCT No.: PCT/JP02/05440

§ 371 (c)(1),
(2), (4) Date: Nov. 17, 2003

(87) PCT Pub. No.: WO02/100123

PCT Pub. Date: Dec. 12, 2002

(65) Prior Publication Data

US 2004/0162046 A1    Aug. 19, 2004

(30) Foreign Application Priority Data

Jun. 5, 2001    (JP) .............................. 2001-169077

(51) Int. Cl.
H04B 1/06    (2006.01)
(52) U.S. Cl. .................... 455/258; 455/260; 455/316; 455/265
(58) Field of Classification Search ................ 455/258, 455/259, 260, 255, 265, 316, 343.1
See application file for complete search history.

(56) References Cited

U.S. PATENT DOCUMENTS

| 5,633,898 | A  | * | 5/1997  | Kishigami et al. .......... 455/258 |
| 5,987,339 | A  | * | 11/1999 | Asano ...................... 455/343.1 |
| 6,230,021 | B1 | * | 5/2001  | Ohdachi ..................... 455/260 |
| 2004/0152438 | A1 | * | 8/2004 | Yamauchi et al. ........ 455/343.1 |

FOREIGN PATENT DOCUMENTS

| JP | 10-190568   | 7/1998 |
| JP | 10-209952   | 8/1998 |
| JP | 2000-13269  | 1/2000 |
| JP | 2000-49682  | 2/2000 |
| JP | 2000-224100 | 8/2000 |

* cited by examiner

Primary Examiner—Lana Le
(74) Attorney, Agent, or Firm—Oblon, Spivak, McClelland, Maier & Neustadt P.C.

(57) ABSTRACT

A radio communication apparatus includes a low-rate clock oscillator for generating a low-rate clock signal used for reception timing estimation; a frequency deviation measuring duration controller for determining a deviation measuring duration of measuring a frequency deviation of the low-rate clock signal in accordance with an intermittent time interval of the radio signal; a frequency deviation measuring section for measuring the frequency deviation of the low-rate clock signal over the deviation measuring duration; and a timing counter for correcting the frequency deviation of the low-rate clock signal, for measuring an intermittent span of the received signal in response to the low-rate clock signal after the correction, and for generating the estimated reception timing of the radio signal.

7 Claims, 5 Drawing Sheets

CONTROL SIGNAL
(TRANSMITTING
INTERVAL $T_{int}$)

| RECEIVING INTERVAL $T_{int}$ | FREQUENCY DEVIATION MEASURING DURATION $T_{ref}$ |
|---|---|
| 100 msec | 5 msec |
| 240 msec | 20 msec |
| 720 msec | 50 msec |
| 10000 msec | 100 msec |
| 40000 msec | 500 msec |

RADIO COMMUNICATION APPARATUS AND ITS RECEPTION TIMING ESTIMATING METHOD

TECHNICAL FIELD

The present invention relates to a radio communication apparatus and its reception timing estimating method for estimating reception timing of a radio signal which is intermittently transmitted at specified time intervals in a radio communication system.

BACKGROUND ART

Conventional radio communication systems widely employ a scheme of intermittently transmitting a control signal such as system broadcasting information and paging information to mobile equipment at specified time intervals. The mobile equipment of such a radio communication system has a low-rate clock oscillator with small power consumption and low oscillation frequency such as an RTC (Real Time Clock), and a high-rate clock oscillator oscillating at a high frequency at high frequency stability such as a TCXO (Temperature Compensated Crystal Oscillator). The mobile equipment measures the transmission time interval of the control signal in response to the output of the low-rate clock oscillator, and estimates the reception timing. In addition, it brings the high-rate clock oscillator into operation only in proximity of the estimated desired reception timing to receive the control signal transmitted intermittently. With such a configuration, the mobile equipment enables the high-rate clock oscillator with rather large power consumption to operate intermittently in synchronization with the transmission timing of the control signal, thereby reducing the power consumption in an incoming call waiting state and the like.

As the low-rate clock oscillator used for the reception timing estimation, an oscillator with low power consumption and low frequency is usually selected. However, such an oscillator usually has a frequency deviation up to about 100 ppm. Thus, its frequency stability is vastly inferior to that of the high-rate clock oscillator of about a few parts per million. Therefore, to estimate the reception timing of the control signal accurately in response to the output of the low-rate clock oscillator, it is necessary to measure the frequency of the low-rate clock oscillator deviation in advance, and to correct the frequency deviation before estimating the reception timing in response to the low-rate clock signal after the correction.

FIG. 1 is a block diagram showing a configuration of mobile equipment employing a conventional frequency deviation estimating method of a low-rate clock signal, which is disclosed in Japanese patent application laid-open No. 2000-13269, for example. The operation of the conventional mobile equipment will be described.

First, a high-rate clock oscillator 1 generates an operation clock signal 102 with a high frequency and small frequency deviation, and supplies it to a timing controller 103 and to another received signal processing section to be used for the signal reception processing, not shown in FIG. 1. In contrast, a low-rate clock oscillator 2 generates a timing clock signal 109 with a low frequency and large frequency deviation.

A PLL 104, receiving the operation clock signal 102, increases its frequency by a specified scaling factor, and outputs a deviation measuring clock signal 105.

In response to a frequency deviation measuring instruction 113 of the timing clock signal 109 output from the timing controller 103, a measuring duration control counter 110 instructs the deviation measuring counter 106 to start counting the number of the clock pulses of the deviation measuring clock signal 105. At the same time, the measuring duration control counter 110 starts counting the number of clock pulses of the timing clock signal 109. The measuring duration control counter 110 has the number of clock pulses of the timing clock signal 109 for defining the duration of the frequency deviation measurement (called "deviation measuring clock number" from now on).

The deviation measuring clock number is set such that desired measurement accuracy is obtained as a result of the frequency deviation measurement. For example, to achieve the frequency deviation measurement at the accuracy of one millionth of the timing clock signal 109, a suitable deviation measuring clock number is set such that the frequency deviation measuring duration, which is defined by the period of the timing clock signal 109 and the deviation measuring clock number, becomes one million times the period of the deviation measuring clock signal 105.

Since the frequency of the deviation measuring clock signal 105 is multiplied by the PLL 104, the frequency deviation measuring duration can be reduced by increasing the multiplication number of the PLL 104. The power consumption of the PLL 104, however, increases with the multiplication number of the deviation measuring clock signal 105.

When the number of clock pulses of the timing clock signal 109 is counted up to the deviation measuring clock number, the measuring duration control counter 110 instructs the deviation measuring counter 106 to stop counting the number of the clock pulses of the deviation measuring clock signal 105, and notifies the timing controller 103 of the completion of the frequency deviation measurement.

Subsequently, the timing controller 103 reads the count value of the deviation measuring counter 106 as to the deviation measuring clock signal 105, and calculates the frequency deviation 115 of the timing clock signal 109 in response to the count value.

The calculated frequency deviation 115 of the timing clock signal 109 is supplied to a reset counter 114 for generating an estimated reception timing to be used for the frequency deviation correction of the timing clock signal 109.

With the foregoing configuration, the conventional radio receiver detects the frequency deviation of the timing clock signal 109 using the deviation measuring clock signal 105 the PLL 104 generates by multiplying the frequency of the operation clock signal 102, thereby reducing the frequency deviation measuring duration. Accordingly, it is necessary for the conventional radio receiver to include the PLL 104 for multiplying the frequency of the operation clock signal 102. This presents a problem of increasing the circuit scale and the power consumption for the frequency deviation measurement.

The present invention is implemented to solve the foregoing problems. Therefore it is an object of the present invention to provide a radio communication apparatus and its reception timing estimating method capable of estimating the reception timing of the radio signal which is transmitted intermittently, at high accuracy by measuring the frequency deviation of the timing clock signal used for generating the estimated reception timing at high accuracy with curbing an increase of the power consumption.

DISCLOSURE OF THE INVENTION

According to one aspect of the present invention, the radio communication apparatus is configured such that it determines a deviation measuring duration of measuring a frequency deviation of a low frequency, low frequency stability timing clock signal in accordance with an intermittent time interval of a radio signal, a target signal to be received.

Thus, when it is expected that the intermittent time interval is long and the estimation error of the reception timing of the radio signal is large, the radio communication apparatus can lengthen the deviation measuring duration to improve the resolution of measuring the frequency deviation of the timing clock signal. As a result, it can correct the frequency of the timing clock signal in response to the frequency deviation measured, thereby offering an advantage of being able to increase the estimation accuracy of the reception timing of the radio signal.

In contrast, when it is expected that the intermittent time interval of the radio signal is short and the estimation error of the reception timing of the radio signal is small, the radio communication apparatus can shorten the deviation measuring duration. Thus, it offers an advantage of being able to curb an increase in the power consumption required to carry out the measurement processing of the frequency deviation of the timing clock signal.

The radio communication apparatus in accordance with the present invention can be configured such that it includes a reception timing detector for detecting a reception timing of the radio signal, and that a frequency deviation measuring duration controller detects an estimation error between an estimated reception timing generated by a timing counter and the actual reception timing of the radio signal, and decides the deviation measuring duration to be used in a subsequent frequency deviation measurement in accordance with the estimation error.

Thus, when a decision is made that continuing the intermittent reception processing of the radio signal will be difficult because of a large estimation error, the radio communication apparatus can lengthen the measuring duration of the frequency deviation of the timing clock signal to improve the resolution of measuring the frequency deviation of the timing clock signal. As a result, it can correct the frequency of the timing clock signal in response to the frequency deviation measured, thereby offering an advantage of being able to increase the estimation accuracy of the reception timing of the radio signal.

The radio communication apparatus in accordance with the present invention can be configured such that the frequency deviation measuring duration controller stores a maximum permissible value of the estimation error of the reception timing, counts a number of times of continuously receiving the radio signal in which the estimation error is greater than the maximum permissible value; and starts the measurement processing of the frequency deviation of the timing clock signal if the number of times of continuously receiving the radio signal exceeds a specified threshold value.

Thus, it halts measuring the frequency deviation of the timing clock signal even if the frequency accuracy of the timing clock signal deteriorates for a short time and the estimation error increases only a short term. It automatically measures the frequency deviation of the timing clock signal only when fluctuations in the frequency accuracy of the timing clock signal continue for a long time and a decision is made that it is difficult to continue the intermittent reception of the radio signal. Therefore it offers an advantage of being able to curb an increase in the power consumption required for the frequency deviation measurement.

The radio communication apparatus in accordance with the present invention can be configured such that the frequency deviation measuring duration controller counts a number of times of continuously receiving the radio signal in which the estimation error is greater than the maximum permissible value; and extends the measuring duration of the frequency deviation of the timing clock signal if the count value exceeds a specified threshold value.

Thus, it offers an advantage of being able increase the estimation accuracy of the reception timing of the radio signal by improving the resolution of the frequency deviation of the timing clock signal measurement, if fluctuations in the frequency accuracy of the timing clock signal continue for a long time, and hence a decision is made that continuing the intermittent reception of the radio signal is difficult.

The radio communication apparatus in accordance with the present invention can be configured such that the frequency deviation measuring duration controller counts the number of times of continuously receiving the radio signal in which the estimation error is less than the maximum permissible value; and reduces the measuring duration of the frequency deviation of the timing clock signal if the count value exceeds a specified threshold value.

Thus, when a decision is made that the fluctuations in the frequency deviation of the timing clock signal are small, the radio communication apparatus can automatically reduces the measuring duration of frequency deviation of the timing clock signal. Thus, it offers an advantage of being able to reduce the power consumption required for the frequency deviation measurement.

BEST MODE FOR CARRYING OUT THE INVENTION

The best mode for carrying out the invention will now be described with reference to the accompanying drawings to explain the present invention in more detail.

Embodiment 1

Figure 1:
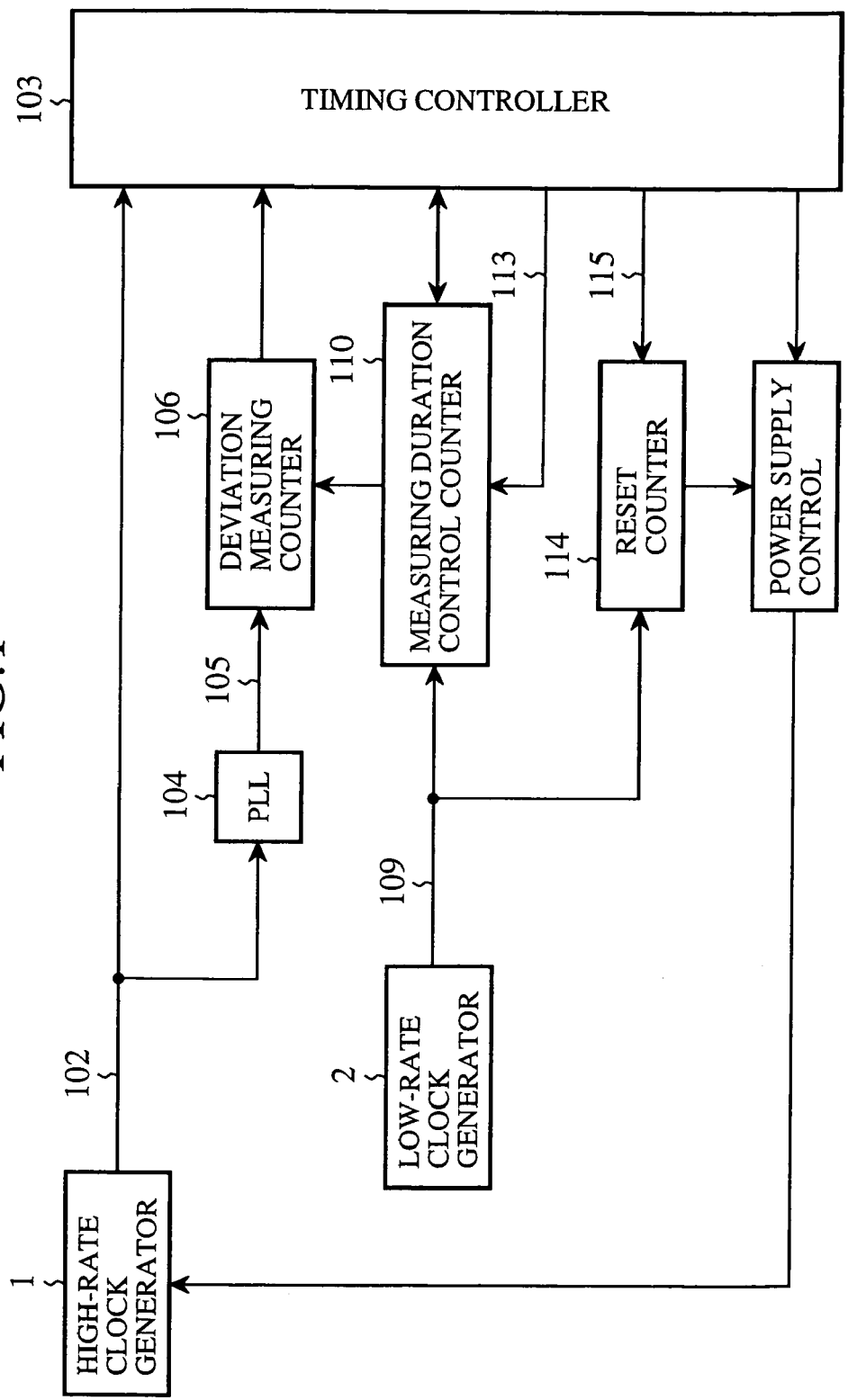
FIG. 1 is a block diagram showing a configuration of a conventional frequency deviation estimating circuit.
Figure 2:
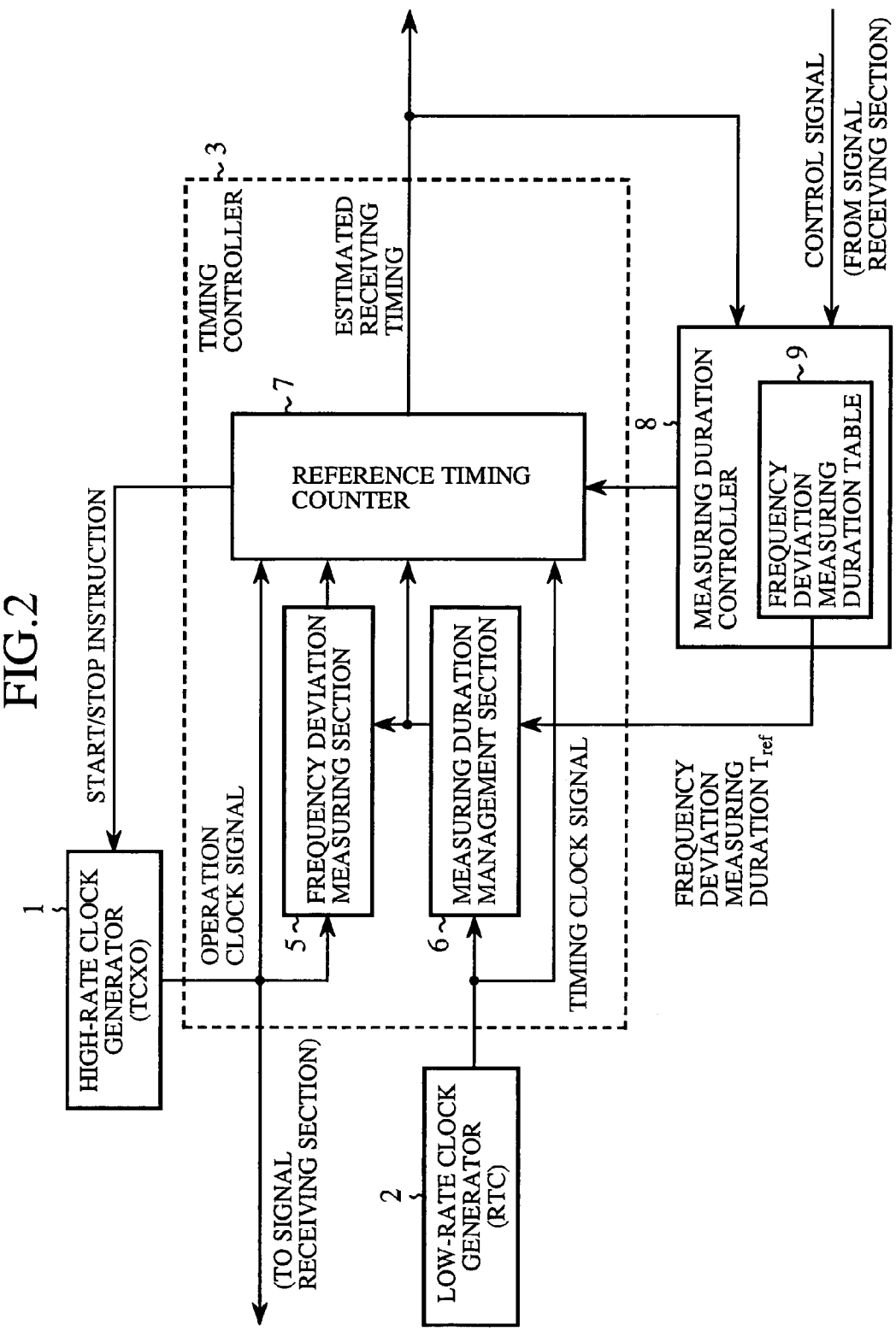
FIG. 2 is a block diagram showing a configuration of an embodiment 1 of the reception timing estimating circuit in accordance with the present invention.

FIG. 2 is a block diagram showing a configuration of an embodiment 1 of the reception timing estimating circuit in accordance with the present invention. In FIG. 2, the reference numeral 1 designates a high-rate clock oscillator (first oscillator) that includes a TCXO and generates a high frequency operation clock signal with high frequency stability; 2 designates a low-rate clock oscillator (second oscillator) that includes an RTC and generates a timing clock signal with low frequency stability, the frequency of which is lower than that of the operation clock signal; and 3 designates a timing controller for estimating the reception timing of the radio signal in response to the timing clock signal, and for controlling the start and stop of the high-rate clock oscillator 1.

In the timing controller 3, the reference numeral 5 designates a frequency deviation measuring section for measuring the frequency deviation of the timing clock signal in response to the operation clock signal; 6 designates a measuring duration management section for measuring the frequency deviation measuring duration in response to the timing clock signal, and for instructing the frequency deviation measuring section 5 to start or stop the deviation measurement; and 7 designates a reference timing counter (timing counter) for correcting the frequency deviation of the timing clock signal, which is measured by the frequency deviation measuring section 5, and for generating a control signal of the high-rate clock oscillator by estimating the reception timing of the radio signal.

The reference numeral 8 designates a measuring duration controller (frequency deviation measuring duration controller) for carrying out the communication control processing of the radio communication apparatus, and for controlling the timing controller 3; and 9 designates a frequency deviation measuring duration table for prestoring the frequency deviation measuring duration managed by the measuring duration management section 6.

Figures 3, 4:
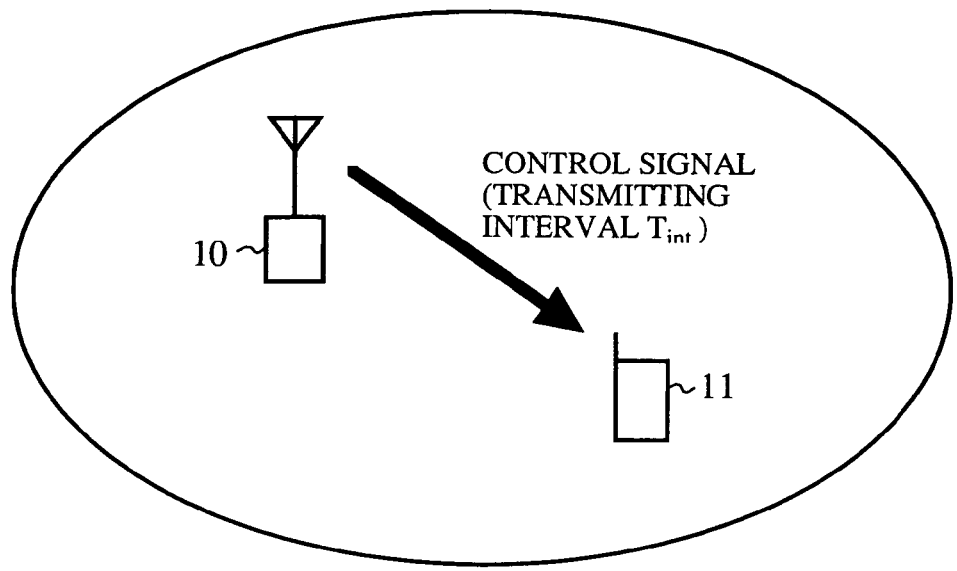
FIG. 3 is a schematic diagram illustrating an operation environment of a radio communication apparatus incorporating the embodiment 1 of the reception timing estimating circuit in accordance with the present invention.
FIG. 4 is a diagram showing a frequency deviation measuring duration table of the embodiment 1 in accordance with the present invention.

FIG. 3 is a schematic diagram illustrating an operation environment of the radio communication apparatus incorporating the embodiment 1. In FIG. 3, the reference numeral 10 designates a base station that transmits a control signal such as a paging and system broadcasting information at every specified transmission interval $T_{int}$; and 11 designates a radio communication apparatus that incorporates the reception timing estimating circuit as shown in FIG. 2, and receives the control signal transmitted from the base station 10.

The base station 10 transmits the control signal by switching the transmission interval $T_{int}$ in response to the total number of the radio communication apparatuses installed in the radio communication system and to the density of the communication requests. On the other hand, the radio communication apparatus 11 continuously receives the control signal transmitted from the base station 10 at every transmission interval $T_{int}$ to wait an incoming call or to monitor the system broadcasting information. The radio communication apparatus 11 normally operates the low-rate clock oscillator 2 at small power consumption to reduce the power consumption. Thus, it estimates the reception timing of the control signal transmitted from the base station 10 in response to the timing clock signal, and carries out the reception processing of the control signal by intermittently activating the high-rate clock oscillator 1 with the large power consumption in response to the estimated reception timing.

Incidentally, the base station 10 transmits the transmission interval $T_{int}$ of the control signal by incorporating it into the control signal as the system broadcasting information. Receiving the control signal, the radio communication apparatus 11 can recognize the transmission interval $T_{int}$ of the base station 10.

Next, the operation of the present embodiment 1 of the reception timing estimating circuit in the radio communication apparatus 11 will be described.

First, at the initial start of the radio communication apparatus 11, the measuring duration controller 8 carries out the reception processing of the control signal continuously for a period of time sufficiently longer than the maximum value of the transmission interval $T_{int}$ of the base station 10 to receive the control signal including the system broadcasting information. Subsequently, the measuring duration controller 8 reads the transmission interval $T_{int}$ included in the system broadcasting information. After that, every time the radio communication apparatus 11 receives the control information including the system broadcasting information, the measuring duration controller 8 reads the transmission interval $T_{int}$ so that the measuring duration controller 8 holds the latest transmission interval $T_{int}$.

Subsequently, the timing controller 3 estimates the reception timing by counting the specified number of pulses of the timing clock signal output from the low-rate clock oscillator 2. For example, assume that the receiving interval $T_{int}$=720 msec, the frequency of the timing clock signal 32 kHz, and the frequency deviation of the timing clock signal is zero. Then, the timing controller 3 can generate the transmission interval $T_{int}$ by counting 23040 pulses of the timing clock signal. Accordingly, it can estimate the next reception timing of the control signal by causing the reference timing counter 7 to count the specified number of pulses of the timing clock signal from the time the measuring duration controller 8 starts receiving the control signal.

However, since the timing clock signal the low-rate clock oscillator 2 outputs has usually low frequency stability, estimating the reception timing by simply counting the specified number of pulses of the timing clock signal will cause an estimation error $\Delta T$ between the actual transmission interval $T_{int}$ and the estimated reception timing. The estimation error $\Delta T$ increases in proportion to the length of the transmission interval $T_{int}$ to be estimated.

Before instructing the high-rate clock oscillator 1 to stop the operation clock signal, the timing controller 3 and measuring duration controller 8 measure the frequency deviation of the timing clock signal in response to the operation clock signal, and corrects the estimation error $\Delta T$ in accordance with the frequency deviation. The frequency deviation measurement processing of the timing clock signal by the timing controller 3 will be described below.

First, the measuring duration controller 8 determines the frequency deviation measuring duration $T_{ref}$, the period of time for measuring the frequency deviation. The frequency deviation of the timing clock signal is calculated by counting the number of pulses of the timing clock signal and that of the operation clock signal with the high frequency decision accuracy output from the high-rate clock oscillator 1 for the frequency deviation measuring duration $T_{ref}$, and by comparing the two count values. Since the measurement resolution of the frequency deviation of the timing clock signal is improved in proportion to the frequency deviation measuring duration $T_{ref}$, it is preferable that the frequency deviation measuring duration $T_{ref}$ be set as long as possible from the viewpoint of the measurement accuracy of the frequency deviation.

On the other hand, to conduct the frequency deviation measurement, since the timing controller 3 must receive the operation clock signal during the frequency deviation measuring duration $T_{ref}$, both the high-rate clock oscillator 1 and low-rate clock oscillator 2 must be operated. Consequently, from the viewpoint of reducing the power consumption of the radio mobile equipment, it is preferable that the frequency deviation measuring duration $T_{ref}$ be set as short as possible.

Thus, the measuring duration controller 8 pay attention to the foregoing fact that the expected value of the estimation error ΔT of the reception timing increases in proportion to the transmission interval $T_{int}$. Thus, when the base station 10 sets a long transmission interval $T_{int}$ (when the expected value of the estimation error ΔT is large), the frequency deviation measuring duration $T_{ref}$ is lengthened to enable the frequency deviation of the timing clock signal to be measured at a high resolution. On the contrary, when the base station 10 sets a short transmission interval $T_{int}$ (when the expected value of the estimation error ΔT is small), the frequency deviation measuring duration $T_{ref}$ is shortened to reduce the power consumption of the frequency deviation measurement.

To determine the frequency deviation measuring duration $T_{ref}$, the measuring duration controller 8 stores in advance the frequency deviation measuring duration table 9 that provides the relationships between the transmission interval $T_{int}$ and the frequency deviation measuring duration $T_{ref}$ as shown in FIG. 4, for example.

The frequency deviation measuring duration table 9 stores a plurality of transmission intervals $T_{int}$. The transmission intervals $T_{int}$ are assumed to be decided at the system design stage of the communication system.

As for the frequency deviation measuring durations $T_{ref}$ corresponding to the plurality of transmission intervals $T_{int}$, they are given appropriate values to achieve desired resolution of the frequency deviation measurement for measuring the expected estimation error ΔT of the transmission intervals $T_{int}$.

Receiving the control signal and reading the transmission interval $T_{int}$ determined by the base station, the measuring duration controller 8 refers to the frequency deviation measuring duration table 9, and reads the frequency deviation measuring duration $T_{ref}$ corresponding to the transmission interval $T_{int}$. For example, when the base station 10 sets the transmission interval at $T_{int}$=720 msec, the measuring duration controller 8 selects the frequency deviation measuring duration $T_{ref}$ of 50 msec.

Subsequently, the measuring duration controller 8 supplies the frequency deviation measuring duration $T_{ref}$ thus selected to the measuring duration management section 6 of the timing controller 3, and instructs it to start the measurement of the frequency deviation of the timing clock signal.

Receiving the instruction on starting the frequency deviation measurement, the measuring duration management section 6 divides the frequency deviation measuring duration $T_{ref}$ by the nominal period of the timing clock signal (31.25 μsec when the nominal frequency is 32 kHz), thereby calculating a deviation measuring clock number K.

Subsequently, the measuring duration management section 6 sends to the frequency deviation measuring section 5 the count start instruction on the operation clock signal, and starts counting the number of pulses of the timing clock signal at the same time. The frequency deviation measuring section 5, receiving the count start instruction, starts counting the number of pulses of the operation clock signal.

When completing the counting of the deviation measuring clock number K, the measuring duration management section 6 supplies the frequency deviation measuring section 5 and reference timing counter 7 with the count stop instruction of the operation clock signal. Thus, the frequency deviation measuring section 5 supplies the reference timing counter 7 with the number of pulses $K_{res}$ of the operation clock signal counted from the count start instruction to the count stop instruction.

On the other hand, receiving the count stop instruction on the operation clock signal from the measuring duration management section 6, the reference timing counter 7 reads the number of pulses $K_{res}$ of the operation clock signal from the frequency deviation measuring section 5, and calculates the frequency deviation of the timing clock signal Δf from the frequency of the operation clock signal and the deviation measuring clock number K according to the following Eq. 1.

$$\Delta f = (K/K_{res}) \cdot f_h - f_1 \qquad \text{Eq. 1.}$$

where $f_h$ is the frequency of the operation clock signal, and $f_1$ is the nominal frequency of the timing clock signal.

When completing the calculation of the frequency deviation Δf, the reference timing counter 7 stops the oscillation of the high-rate clock oscillator 1.

Subsequently, the reference timing counter 7 corrects the frequency of the timing clock signal in accordance with the frequency deviation Δf. Then, it measures the transmission interval $T_{int}$ in accordance with the timing clock signal corrected, and estimates the next reception timing of the control signal. As a result, in synchronism with the estimated reception timing, the reference timing counter 7 controls the start and stop of the oscillation of the high-rate clock oscillator 1, thereby controlling the intermittent output of the operation clock signal.

If the base station 10 sends the instruction on the change of the transmission interval $T_{int}$ during the intermittent reception processing of the control signal, the measuring duration controller 8 determines the frequency deviation measuring duration $T_{ref}$ corresponding to the transmission interval $T_{int}$ after the change with reference to the frequency deviation measuring duration table 9, and instructs the measuring duration management section 6 to measure the frequency deviation of the timing clock signal. Receiving the instruction, the measuring duration management section 6 starts the high-rate clock oscillator 1 via the reference timing counter 7 to measure the frequency deviation Δf of the timing clock signal again in response to the frequency deviation measuring duration $T_{ref}$ corrected by the method as described above. Then, the reference timing counter 7 carries out the frequency correction of the timing clock signal in accordance with the frequency deviation Δf obtained as a result of the remeasurement, and estimates the reception timing.

In this way, the present embodiment 1 of the reception timing estimating circuit automatically switches the measuring duration $T_{ref}$ for calculating the frequency deviation Δf of the timing clock signal with the low frequency stability in accordance with the transmission interval $T_{int}$ of the control signal set by the base station 10. Accordingly, when the transmission interval $T_{int}$ is long and the estimation error ΔT of the reception timing is expected to be large, the frequency deviation measuring duration $T_{ref}$ is lengthened to increase the measurement resolution of the frequency deviation Δf and to improve the accuracy of the frequency deviation measurement. In contrast, when the transmission interval $T_{int}$ is short and the estimation error ΔT of the reception timing is expected to be small, the frequency deviation measuring duration $T_{ref}$ is shortened to curb an increase of the power consumption required for the measurement processing of the frequency deviation Δf.

In the present embodiment 1, although the measuring duration controller 8 instructs to measure the frequency deviation of the timing clock signal at the start of the radio communication apparatus and at the change of the transmission interval $T_{int}$ by the base station 10, this is not essential. For example, a configuration is also possible in which the measuring duration controller 8 includes a timer so that the measurement processing of the frequency deviation of the timing clock signal is carried out at specified time intervals.

In addition, although the present embodiment is configured such that the measuring duration controller 8 has the frequency deviation measuring duration table 9 recording the frequency deviation measuring durations $T_{ref}$ corresponding to the plurality of transmission intervals $T_{int}$, and changes the frequency deviation measuring duration $T_{ref}$ in response to the transmission interval $T_{int}$ with reference to the frequency deviation measuring duration table 9, the decision scheme of the frequency deviation measuring duration $T_{ref}$ is not limited to such a method. For example, a method can also be employed which calculates the frequency deviation measuring duration $T_{ref}$ by multiplying the transmission interval $T_{int}$ by a specified transformation coefficient. Alternatively, a method can also be used such as calculating the frequency deviation measuring duration $T_{ref}$ by applying other mathematical expressions to the transmission interval $T_{int}$.

Embodiment 2

In the foregoing embodiment 1, the measuring duration controller 8 includes the frequency deviation measuring duration table 9, and determines the frequency deviation of the timing clock signal measuring duration $T_{ref}$ in accordance with the transmission interval $T_{int}$ of the control signal set by the frequency base station 10. In the present embodiment 2, the measuring duration controller 8 compares the reception timing the timing controller 3 estimates in response to the timing clock signal after the frequency deviation correction with the timing at which the control signal is actually received, detects the estimation error between the two timings, and measures the frequency deviation of the timing clock signal by lengthening the frequency deviation measuring duration $T_{ref}$ when the estimation error is greater than a specified threshold value.

The present embodiment 2 differs from the foregoing embodiment 1 only in that it includes a reception timing detector for detecting the reception timing of the control signal, calculates the estimation error between the estimated reception timing and the actual reception timing of the control signal, and determines the frequency deviation measuring duration $T_{ref}$ in accordance with the estimation error. Since the remaining configuration is identical, the description thereof is omitted by using the same reference numerals.

Figure 5:
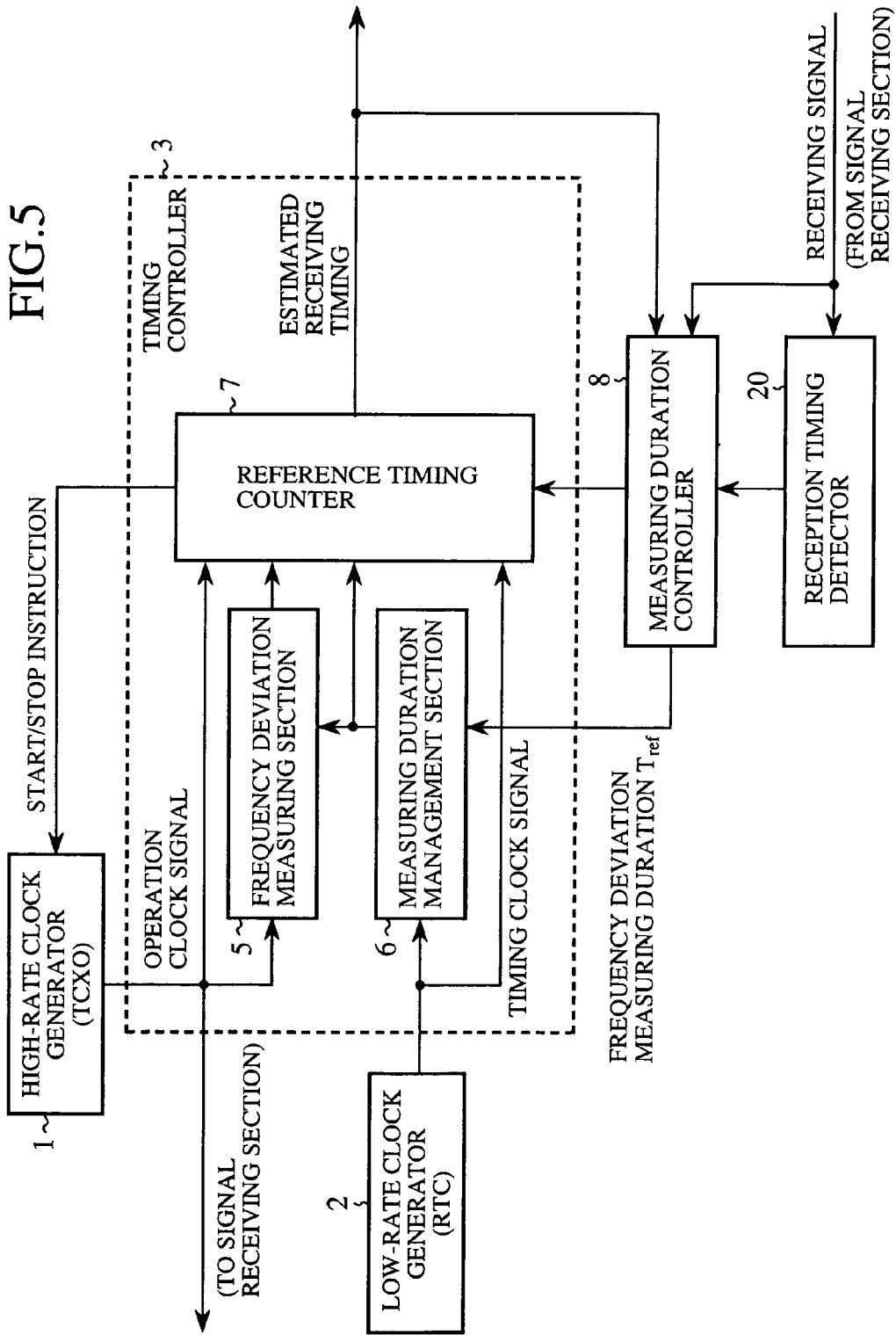
FIG. 5 is a block diagram showing a configuration of an embodiment 2 of the reception timing estimating circuit in accordance with the present invention.

FIG. 5 is a block diagram showing a configuration of the present embodiment 2 of the reception timing estimating circuit. In FIG. 5, the reference numeral 20 designates a reception timing detector for receiving the received signal demodulated by the signal receiving section (not shown in FIG. 5) of the radio communication apparatus, and for detecting the control signal in the received signal.

Next, the operation of the present embodiment 2 of the reception timing estimating circuit will be described. First, the reception timing detector 20, receiving the received signal demodulated by the signal receiving section (not shown in FIG. 5), detects a specified detection word inserted into the received signal to identify the control signal, and supplies the reception timing of the detected control signal to the measuring duration controller 8.

On the other hand, according to the method of the foregoing embodiment 1, the reference timing counter 7 of the timing controller 3 generates the estimated reception timing in response to the timing clock signal after passing through the frequency deviation correction.

The measuring duration controller 8 receives the estimated reception timing and the actual reception timing of the control signal the reception timing detector 20 outputs, and detects the estimation error $\Delta T$ of the reception timing. The measuring duration controller 8, which stores a maximum permissible value $\Delta T_{max}$ of the estimation error of the reception timing in advance, compares the estimation error $\Delta T$ with the maximum permissible value $\Delta T_{max}$. When the estimation error $\Delta T$ is greater than the maximum permissible value $\Delta T_{max}$, the measuring duration controller 8 lengthens the frequency deviation measuring duration $T_{ref}$ which has been determined with reference to the frequency deviation measuring duration table 9 shown in FIG. 4.

For example, consider the case where the receiving interval is set at $T_{int}=720$ msec and the frequency deviation measuring duration $T_{ref}=50$ msec is selected. If the estimation error $\Delta T$ exceeds the maximum permissible value $\Delta T_{max}$, the measuring duration controller 8 lengthens the frequency deviation measuring duration $T_{ref}$ by 20% to $T_{ref}=60$ msec, for example, and notifies the measuring duration management section 6 of it.

As for the maximum permissible value $\Delta T_{max}$, it is assumed here that an appropriate value is set considering the startup time of the signal receiving section (not shown in FIG. 5), which is required from the start of the high-rate clock oscillator 1 to the time enabling the radio communication apparatus to receive the control signal.

Subsequently, the measuring duration controller 8 instructs the measuring duration management section 6 to measure the frequency deviation of the timing clock signal. The measuring duration management section 6 and frequency deviation measuring section 5 measure the frequency deviation using the lengthened frequency deviation measuring duration $T_{ref}$ in the same manner as the foregoing embodiment 1, and supplies the frequency deviation to the reference timing counter 7. Thus, the reference timing counter 7 corrects the timing clock signal in accordance with the frequency deviation, and generates the estimated reception timing, in response to which the start/stop of the high-rate clock oscillator 1 is controlled.

As described above, the present embodiment 2 of the reception timing estimating circuit is configured such that it includes the reception timing detector 20 for detecting the actual reception timing of the control signal which is transmitted intermittently, and that when the estimation error $\Delta T$ between the estimated reception timing generated by the reference timing counter and the actual reception timing of the control signal is greater than the maximum permissible value $\Delta T_{max}$, the measuring duration controller 8 extends the frequency deviation measuring duration $T_{ref}$ and instructs the measurement of the frequency deviation of the timing clock signal. Accordingly, if the correct estimation of the reception timing cannot be carried out because of an increase in the fluctuations in the frequency of the low-rate clock oscillator 2 due to variations in the environment in which the radio communication apparatus is used such as the variation in the ambient temperature, for example, the present embodiment automatically extends the frequency deviation measuring duration $T_{ref}$ to enable the measurement of the frequency deviation of the timing clock signal at a higher measurement resolution, thereby being able to maintain the accuracy of the estimation of the reception timing by the reference timing counter 7.

Although the measuring duration controller 8 extends the frequency deviation measuring duration $T_{ref}$ by 20% when the estimation error of the estimated reception timing $\Delta T$ is greater than the maximum permissible value $\Delta T_{max}$ in the present embodiment 2, an extension amount of the frequency deviation measuring duration $T_{ref}$ is not limited to 20%. It can be any suitable value for obtaining the desired resolution of the frequency deviation measurement accuracy when the estimation error $\Delta T$ is increased.

Embodiment 3

In the foregoing embodiment 2, the measuring duration controller 8 instructs to measure the frequency deviation when the estimation error $\Delta T$ of the estimated reception timing the reference timing counter 7 generates is greater than the maximum permissible value $\Delta T_{max}$. In contrast with this, in the present embodiment 3, the measuring duration controller 8 measures the number of times of continuously receiving the control signal in which the estimation error $\Delta T$ is greater than the maximum permissible value $\Delta T_{max}$, and the number of times of continuously receiving the control signal in which the estimation error $\Delta T$ is equal to or less than the maximum permissible value $\Delta T_{max}$, and adjusts the frequency deviation measuring duration $T_{ref}$ of the timing clock signal in response to the count values.

The present embodiment 3 differs from the foregoing embodiment 2 only in that the measuring duration controller 8 includes counters each for measuring the number of times of continuously receiving the control signal, and adjusts the frequency deviation measuring duration in response to the count values. Since the remaining configuration is identical, the description thereof is omitted by using the same reference numerals.

Figure 6:
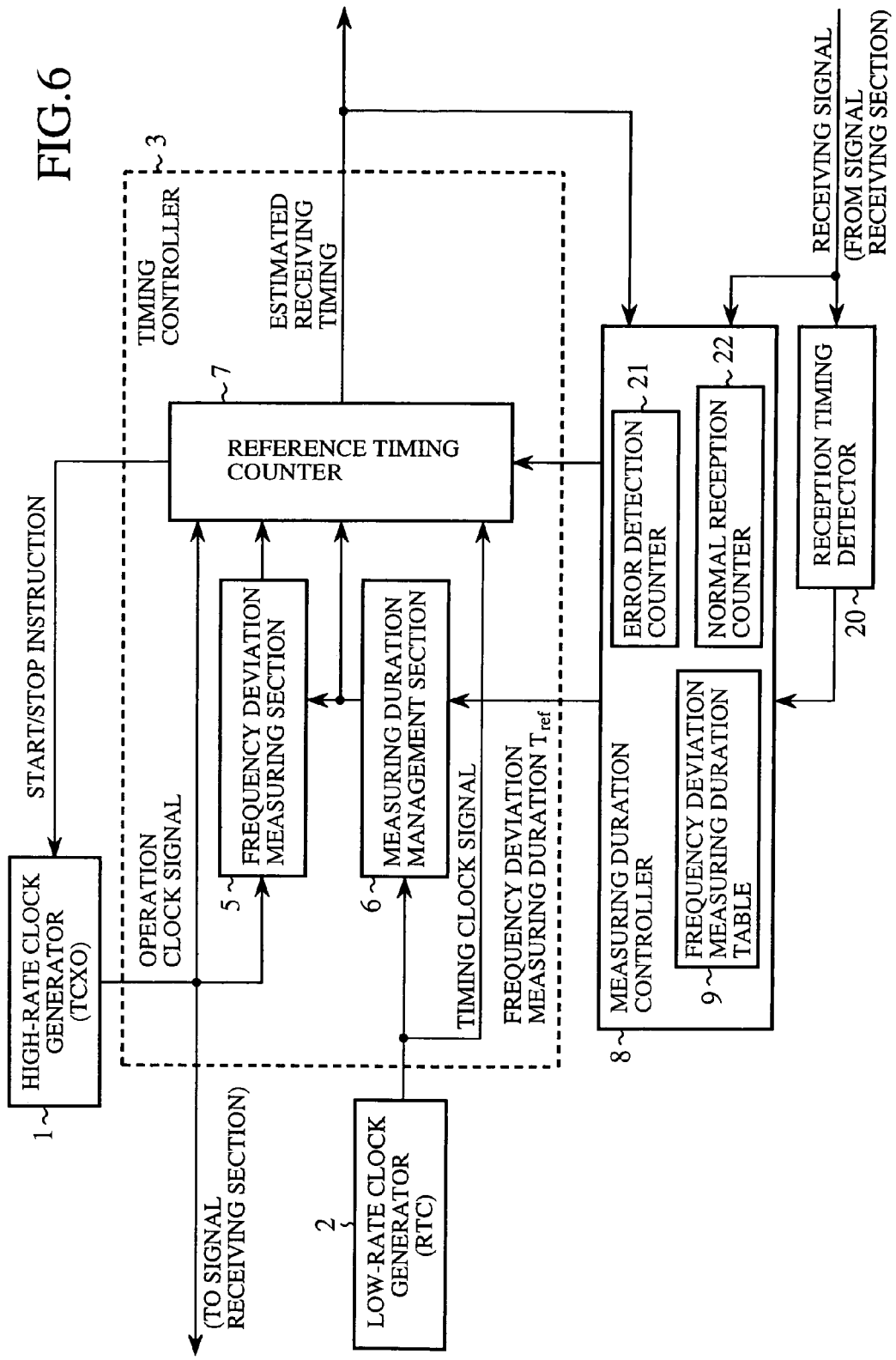
FIG. 6 is a block diagram showing a configuration of an embodiment 3 of the reception timing estimating circuit in accordance with the present invention.

FIG. 6 is a block diagram showing a configuration of the present embodiment 3 of the reception timing estimating circuit. In FIG. 6, the reference numeral 21 designates an error detection counter for measuring the number of times of continuously receiving the control signal in which the estimation error $\Delta T$ of the estimated reception timing is greater than the maximum permissible value $\Delta T_{max}$; and 22 designates a normal reception counter for measuring the number of times of continuously receiving the control signal in which the estimation error $\Delta T$ is equal to or less than the maximum permissible value $\Delta T_{max}$.

Next, the operation of the present embodiment 3 of the reception timing estimating circuit will be described. First, according to the method described in the foregoing embodiment 1, the measuring duration controller 8 determines the frequency deviation measuring duration $T_{ref}$ with reference to the frequency deviation measuring duration table 9. The measuring duration management section 6 and frequency deviation measuring section 5 measure the frequency deviation of the timing clock signal over the frequency deviation measuring duration $T_{ref}$. The reference timing counter 7 carries but the frequency correction of the timing clock signal in response to the measurement result, generates the estimated reception timing, and controls the start/stop of the high-rate clock oscillator 1.

While the radio communication apparatus is receiving the control signal by intermittently operating the high-rate clock oscillator 1, the measuring duration controller 8 compares the estimated reception timing the reference timing counter 7 generates with the actual reception timing the reception timing detector 20 outputs every time the control signal is received, and calculates the estimation error $\Delta T$ of the estimated reception timing.

Subsequently, the measuring duration controller 8 compares the estimation error $\Delta T$ with the maximum permissible value $\Delta T_{max}$ of the estimation error. When the estimation error $\Delta T$ is greater than the maximum permissible value $\Delta T_{max}$, it makes a decision that the frequency deviation of the timing clock signal exceeds the acceptable range. Thus, it causes the error detection counter 21 to count up, and the normal reception counter 22 to initialize its count value to zero at the same time.

In contrast, when the estimation error $\Delta T$ is equal to or less than the maximum permissible value $\Delta T_{max}$, it makes a decision that the frequency deviation of the timing clock signal is within the acceptable range. Thus, it causes the normal reception counter 22 to count up, and the error detection counter 21 to initialize its count value to zero at the same time.

With the foregoing configuration, the error detection counter 21 hold the number of times of continuously receiving the control signal in which the estimation error $\Delta T$ is greater than the maximum permissible value $\Delta T_{max}$. On the other hand, the normal reception counter 22 holds the number of times of continuously receiving the control signal in which the estimation error $\Delta T$ is less than the maximum permissible value $\Delta T_{max}$.

If the frequency deviation of the timing clock signal fluctuates in connection with the variations in the environment in which the radio communication apparatus is used while the radio communication apparatus is receiving the control signal intermittently, the estimation error $\Delta T$ will exceed the maximum permissible value $\Delta T_{max}$ continuously over a plurality of reception timings of the control signal, thereby increasing the count value of the error detection counter 21.

The measuring duration controller 8 holds a threshold value $K_1$ of the number of times of continuously receiving the control signal for making a decision as to whether to carry out the measurement of the frequency deviation of the timing clock signal or not. If the count value of the error detection counter 21 exceeds the threshold value $K_1$, the measuring duration controller 8 extends the frequency deviation measuring duration $T_{ref}$ as in the foregoing embodiment 2, notifies the measuring duration management section 6 of the duration $T_{ref}$, and instructs it to start the frequency deviation measurement.

As for the threshold value $K_1$, it is set at an appropriate value to handle the variation in the environment in which the radio communication apparatus is used, such as the ambient temperature.

The frequency deviation measuring section 5 measures the frequency deviation of the timing clock signal over the extended frequency deviation measuring duration $T_{ref}$. After that, the reference timing counter 7 generates the estimated reception timing in response to the timing clock signal whose frequency deviation is corrected. After the frequency deviation measurement, the estimation error of the estimated reception timing $\Delta T$ decreases, and hence the estimation error $\Delta T$ becomes less than the maximum permissible value $\Delta T_{max}$. Thus, the count value of the normal reception counter 22 increases.

The measuring duration controller 8 holds a threshold value $K_2$ of the number of times of continuously receiving the control signal for making a decision as to whether the frequency deviation of the timing clock signal is stable or not. If the count value of the normal reception counter 22 exceeds the threshold value $K_2$, the measuring duration controller 8 makes a decision that the variation in the environment of the radio communication terminal is small, and hence the fluctuations in the frequency deviation of the timing clock signal are small. Thus, the measuring duration controller 8 shortens the extended frequency deviation measuring duration $T_{ref}$ to the frequency deviation measuring duration $T_{ref}$ determined by the frequency deviation measuring duration table 9.

As for the threshold value $K_2$, it is set at the number of times of receiving the control signal during a sufficiently long period of time such as a quarter, half or one hour in advance, which is long enough for making a decision as to the stability of the low-rate clock oscillator 2.

With such an arrangement, the present embodiment 3 halts measuring the frequency deviation of the timing clock signal even if the frequency accuracy of the timing clock signal deteriorates for a short time and the estimation error $\Delta T$ increases only a short term. The present embodiment 3 measures the frequency deviation of the timing clock signal by automatically extending the frequency deviation measuring duration $T_{ref}$ only when the frequency accuracy of the timing clock signal fluctuates for a long time and the count value of the error detection counter 21 exceeds the specified threshold value $K_1$, and when it makes a decision that it is difficult to hold the synchronization with the base station 10. Therefore the present embodiment 3 can achieve the sufficient frequency deviation measurement resolution to correct the frequency deviation, and can curb an increase in the power consumption at the same time.

Furthermore, when the count value of the normal reception counter 22 exceeds the threshold value $K_2$, the present embodiment 3 makes a decision that the frequency accuracy of the low-rate clock oscillator 2 is stable and the fluctuations in the frequency deviation of the timing clock signal are small. In this case, the present embodiment 3 automatically shortens the extended frequency deviation measuring duration $T_{ref}$ to the specified initial value as described above. Thus, it can reduce the power consumption for the frequency deviation measurement processing thereafter.

Incidentally, although the present embodiment 3 is configured such that when the count value of the normal reception counter 22 exceeds the threshold value $K_2$, the measuring duration controller 8 shortens the frequency deviation measuring duration $T_{ref}$ to the frequency deviation measuring duration $T_{ref}$ determined according to the frequency deviation measuring duration table 9, this is not essential. Such a configuration is also possible that shortens the frequency deviation measuring duration $T_{ref}$ by a specified ratio, only when the count value of the normal reception counter 22 exceeds the threshold value $K_2$.

For example, in the case where the frequency deviation measuring duration is set at $T_{ref}=50$ msec, such a configuration is also possible in which the measuring duration controller 8 shortens the frequency deviation measuring duration $T_{ref}$ by 20% to $T_{ref}=40$ msec if the normal reception counter 22 exceeds the threshold value $K_2$.

INDUSTRIAL APPLICABILITY

As described above, the radio communication apparatus and its reception timing estimating method in accordance with the present invention are suitable for precisely estimating the reception timing of the radio signal which is transmitted intermittently, by measuring the frequency deviation of the timing clock signal used for generating the estimated reception timing at high accuracy with curbing the increase in the power consumption.

What is claimed is:

1. A radio communication apparatus for carrying out reception processing of a radio signal which is transmitted intermittently at specified time intervals, said radio communication apparatus comprising:
   a first oscillator for generating an operation clock signal used for the reception processing of the radio signal;
   a second oscillator for generating a timing clock signal with a predetermined frequency lower than the frequency of the operation clock signal;
   a frequency deviation measuring duration controller for determining a deviation measuring duration of measuring a frequency deviation of the timing clock signal in accordance with an intermittent time interval of the radio signal;
   a frequency deviation measuring section for measuring the frequency deviation of the timing clock signal in response to the operation clock signal over the deviation measuring duration; and
   a timing counter for correcting the frequency deviation of the timing clock signal, for measuring an intermittent span of the received signal in response to the timing clock signal after the correction, and for starting said first oscillator in synchronization with an estimated reception timing of the radio signal.

2. The radio communication apparatus according to claim 1, further comprising a reception timing detector for detecting reception timing of the radio signal actually received, wherein
   said frequency deviation measuring duration controller detects an estimation error of the estimated reception timing against an actual reception timing, and decides the deviation measuring duration to be used in a subsequent frequency deviation measurement in accordance with the estimation error; and
   said timing counter corrects the frequency deviation of the timing clock signal, generates the estimated reception timing of the radio signal by measuring the intermittent span of the received signal in response to the timing clock signal after the correction, and starts the first oscillator in synchronization with the estimated reception timing.

3. The radio communication apparatus according to claim 2, wherein
   said frequency deviation measuring duration controller further stores a maximum permissible value of the estimation error of the estimated reception timing in advance, makes a decision as to whether the estimation error is greater than the maximum permissible value every time of carrying out the reception processing of the radio signal, and counts a number of times of continuously receiving the radio signal in which the estimation error is greater than the maximum permissible value; and
   said frequency deviation measuring section has a configuration of measuring the frequency deviation of the timing clock signal over a specified deviation measuring duration, if the number of times of continuously receiving the radio signal exceeds a specified threshold value.

4. The radio communication apparatus according to claim 2, wherein said frequency deviation measuring duration controller has a configuration of storing a maximum permissible value of the estimation error of the estimated reception timing in advance; making a decision as to whether the estimation error is greater than the maximum permissible value every time of carrying out the reception processing of the radio signal; counting a number of times of continuously receiving the radio signal in which the estimation error is greater than the maximum permissible value; and increases the deviation measuring duration by said frequency deviation measuring section in accordance with the number of times of continuously receiving.

5. The radio communication apparatus according to claim 2, wherein said frequency deviation measuring duration controller has a configuration of storing a maximum permissible value of the estimation error of the estimated reception timing in advance; making a decision as to whether the estimation error is less than the maximum permissible value every time of carrying out the reception processing of the radio signal; counting a number of times of continuously receiving the radio signal in which the estimation error is less than the maximum permissible value; and decreases the deviation measuring duration by said frequency deviation measuring section in accordance with the number of times of continuously receiving.

6. A reception timing estimating method of a radio communication apparatus for carrying out reception processing of a radio signal which is transmitted intermittently at specified time intervals, said reception timing estimating method comprising:

an operation clock oscillation step of generating an operation clock signal used for the reception processing of the radio signal;

a timing clock oscillation step of generating a timing clock signal with a predetermined frequency lower than the frequency of the operation clock signal;

a frequency deviation measuring duration control step of determining a deviation measuring duration of measuring a frequency deviation of the timing clock signal in accordance with an intermittent time interval of the radio signal;

a frequency deviation measuring step of measuring the frequency deviation of the timing clock signal in response to the operation clock signal over the deviation measuring duration; and an estimated reception timing generating step of correcting the frequency deviation of the timing clock signal, of measuring an intermittent span of the received signal in response to the timing clock signal after the correction, and of starting the operation clock oscillation step in synchronization with the estimated reception timing of the radio signal.

7. A reception timing estimating method of a radio communication apparatus for carrying out reception processing of a radio signal which is transmitted intermittently at specified time intervals, said reception timing estimating method comprising:

an operation clock oscillation step of generating an operation clock signal used for the reception processing of the radio signal;

a timing clock oscillation step of generating a timing clock signal with a predetermined frequency lower than the frequency of the operation clock signal;

a frequency deviation measuring step of measuring a frequency deviation of the timing clock signal in response to the operation clock signal over a specified deviation measuring duration;

an estimated reception timing generating step of correcting the frequency deviation of the timing clock signal, of generating an estimated reception timing of the radio signal by measuring an intermittent span of the received signal in response to the timing clock signal after the correction, and of starting the operation clock oscillation step in synchronization with the estimated reception timing;

a reception timing detection step of detecting a reception timing of an actually received radio signal; and a frequency deviation measuring duration control step of detecting an estimation error of the estimated reception timing against an actual reception timing, and of deciding the deviation measuring duration to be used in a subsequent frequency deviation measurement in accordance with the estimation error.

* * * * *